US006794750B2

(12) United States Patent
Matsuda

(10) Patent No.: US 6,794,750 B2
(45) Date of Patent: Sep. 21, 2004

(54) SEMICONDUCTOR DEVICE

(75) Inventor: Shuichi Matsuda, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/222,524

(22) Filed: Dec. 28, 1998

(65) Prior Publication Data

US 2002/0000654 A1 Jan. 3, 2002

(30) Foreign Application Priority Data

Dec. 26, 1997 (JP) ............................................. 9-359478

(51) Int. Cl.⁷ ......................... H01L 23/43; H01L 23/48; H01L 29/40; H01L 23/14
(52) U.S. Cl. ....................... 257/737; 257/738; 257/780; 257/778; 257/701; 257/691; 257/698; 257/774; 257/775; 257/702; 257/787; 257/692
(58) Field of Search ................................ 257/737, 738, 257/780, 778, 701, 702, 691, 698, 774, 775, 758, 700, 668

(56) References Cited

U.S. PATENT DOCUMENTS

| 5,399,898 A | * | 3/1995 | Rostoker ..................... 257/499 |
| 5,475,236 A | * | 12/1995 | Yoshizaki .................... 257/48 |
| 5,548,091 A | | 8/1996 | DiStefano et al. |
| 5,635,761 A | * | 6/1997 | Cao et al. ................... 257/700 |
| 5,686,764 A | * | 11/1997 | Fulcher ....................... 527/778 |
| 5,707,894 A | | 1/1998 | Hsiao |
| 5,844,317 A | * | 12/1998 | Bertolet et al. ............. 257/773 |
| 5,905,303 A | * | 5/1999 | Kata et al. .................. 257/701 |
| 5,925,930 A | * | 7/1999 | Farnworth et al. .......... 257/737 |
| 5,952,726 A | * | 9/1999 | Liang .......................... 257/778 |
| 5,990,546 A | * | 11/1999 | Igarashi et al. ............. 257/700 |
| 6,064,114 A | * | 5/2000 | Higgins, III ................ 257/698 |
| 6,441,487 B2 | * | 8/2002 | Elenius et al. .............. 257/738 |

OTHER PUBLICATIONS

Matuda S. et al "Simple–Structure, Generally Applicable Chip–Scale Package" Proceedings of the electronic components and technology conference, US, New York, IEEE, vol. Conf. 45, 1995, pp. 218–223, XP000624972, ISBN: 0–7803–2737–3.

Matsuda S. et al "Development of Chip Scale Package (CSP) Using Through–Hole Bonding and Transfer Molding Process" NEC Research and Development, JP, Nippon Electric LTD. Tokyo, vol. 38, No. 3, Jul. 1, 1997, pp. 318–325, XP000742627, ISSN: 0547–051X.

"Improved Method for C–4 Chip Join" IBM Technical Disclosure Bulletin, US, IBM Corp. New York, vol. 31, No. 6, Nov. 1, 1988, pp. 335–336, XP000054208, ISSN: 0018–8689.

* cited by examiner

*Primary Examiner*—Nitin Parekh
(74) *Attorney, Agent, or Firm*—Hayes Soloway P.C.

(57) ABSTRACT

A semiconductor device equipped with a TAB (tape automated bonding) tape. A desired pattern of wiring is formed on one surface of the TAB tape and a semiconductor chip having two or more chip electrodes is disposed on the other surface of the TAB tape. The wiring and the chip electrodes are electrically interconnected via bumps that are formed in through-holes of the wiring in conforming relationship with the chip electrodes. This prevents fault connection between the chip electrodes and the bumps.

36 Claims, 3 Drawing Sheets

SEMICONDUCTOR DEVICE

BACKGROUND OF THE INVENTION

1. Field of the Invention

This invention relates to a semiconductor device and more particularly to a semiconductor device in which any fault connection between chip electrodes and a wiring on a wiring substrate is prevented.

2. Description of the Related Art

There is currently known a semiconductor device called chip size package (hereinafter called the CSP) whose size is reduced almost to the size of a semiconductor chip.

The conventional CSPs are separated into a number of groups according to the kind of an intermediary for mounting the semiconductor chip. This intermediary is exemplified by a film carrier.

However, if the wiring on the film carrier and the chip electrodes on the semiconductor chip are interconnected by pressing under heat, such joint tends to be separated due to possible stresses so that the joint would become electrically opened.

FIG. 7 of the accompanying drawings of the present specification is a perspective view showing a conventional ordinary-type CSP.

As shown in FIG. 7, a semiconductor chip 1 is disposed on a TAB (Tape Automated Bonding) tape 2, which is a film carrier, has a size substantially equal to that of the TAB tape 2.

Aluminum (Al) chip electrodes (not shown) of the semiconductor chip 1 are electrically connected with bumps 9 via non-illustrated bumps in through-holes of the TAB tape 2. The whole of the semiconductor chip 1 is sealed by sealing resin 8 such as epoxy resin.

FIG. 8 is a fragmentary, enlarged cross-sectional view taken along line VIII—VIII of FIG. 7.

In FIG. 8, the TAB tape 2 is composed of a polyimide tape 2b which is to be a base, and a wiring 2a of copper foil formed on the polyimide tape 2b, serving as a film carrier (a wiring substrate) on which the semiconductor chip 1 is to be supported.

The wiring 2a is prior formed on the polyimide tape 2b in a desired wiring pattern by vapor deposition of copper in the through-holes of the polyimide tape 2b. On the exposed surfaces of each bump 6, another bump 5 as of nickel (Ni) or gold (Au) is formed by plating.

The chip electrodes 4 are electrically connected with a wiring layer 3 in the semiconductor chip 1, the surface of which is covered with a chip covering film 12 so as to expose the chip electrodes 4.

The thus fabricated film carrier is used in assembling the semiconductor package as follows:

Firstly, with the bumps 5 aligned in confronting relationship with the chip electrodes 4, the wiring 2a are pressed against the bumps 6 under heat or ultrasonic waves using bonding tools. As a result, the individual bump 5 deforms to form gold-aluminum (Au.Al) alloy at the contact surface so that the bump 5 and the corresponding chip electrode 4 are pressed against each other under heat. Then the semiconductor chip 1 and chip covering film 12 are attached to each other by an adhesive material 11 to complete the semiconductor package. In the meantime, a solder resist 10 is applied over the surface of the exposed wiring 2a for corrosion-proofing.

However, according to this conventional technology, after the bump 5 and the chip electrode 4 are interconnected as pressed under heat, their joint tends to be separated due to possible stress as of the TAB tape 2, and as a result, the separated joint will be found as a fault connection during inspection after assembling of the semiconductor package.

SUMMARY OF THE INVENTION

With the foregoing problems in view, it is an object of this invention to provide a semiconductor device free of any connection fault between chip electrodes and bumps.

According to a first aspect of the invention, the above object is accomplished by a semiconductor device which comprises: a wiring substrate having a predetermined pattern of wiring formed on one surface; a semiconductor chip disposed on the other surface of the wiring substrate and having two or more chip electrodes in a common wiring layer; the wiring substrate having a number of through-holes; and a number of bumps formed respectively in the through-holes in conforming relationship with the chip electrodes and electrically connecting the wiring with the chip electrodes.

According to a second aspect of the invention, the above object is accomplished alternatively by a semiconductor device which comprises: a wiring substrate having a predetermined pattern of wiring formed on one surface; a semiconductor chip disposed on the one surface of the wiring substrate and having two or more chip electrodes in a common wiring layer; and a number of bumps disposed on the wiring respectively in conforming relationship with the chip electrodes and electrically connecting the wiring with the chip electrodes.

According to a third aspect of the invention, the above object is accomplished in another alternative way by a semiconductor device which comprises: a TAB (tape automated bonding) tape having a predetermined pattern of wiring formed on one surface; a semiconductor chip disposed on the other surface of the TAB tape and having two or more chip electrodes in a common wiring layer; the TAB tape having a number of through-holes; and a number of bumps formed respectively in the through-holes in conforming relationship with the chip electrodes and electrically connecting the wiring with the chip electrodes.

According to a fourth aspect of the invention, the above object is accomplished by still another alternative way by a semiconductor device which comprises: a TAB tape having a predetermined pattern of wiring formed on one surface; a semiconductor chip disposed on the one surface of the TAB tape and having two or more chip electrodes in a common wiring layer; and a number of bumps disposed on the wiring respectively in conforming relationship with the chip electrodes and electrically connecting the wiring with the chip electrodes.

In the semiconductor device of any one of the first through fourth aspects of the invention, as a preferred feature, the chip electrodes are arranged from an edge of the semiconductor chip toward its inner side.

As another preferred feature, the chip electrodes are arranged parallel to an edge of the semiconductor chip and the wiring is bent at at least one position.

As still another preferred feature, the chip electrodes are arranged parallel to an edge of the semiconductor chip and the wiring has an end width larger than an inter-electrode distance between the chip electrodes.

As a further preferred feature, the chip electrodes comprise at least one kind of terminals selected from ground, power-source and signal terminals of the semiconductor chip.

In the construction of the semiconductor device according to this invention, the device has at least two sets of chip terminals and bumps for a common wiring layer so that if the joint at one position happens to be separated, the remaining joints would be kept from being separated. Accordingly this semiconductor package is free of any connection fault.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The principles of this invention are particularly useful when applied to a semiconductor device, various preferred embodiments of which will now be described with reference to the accompanying drawings.

Figure 1:
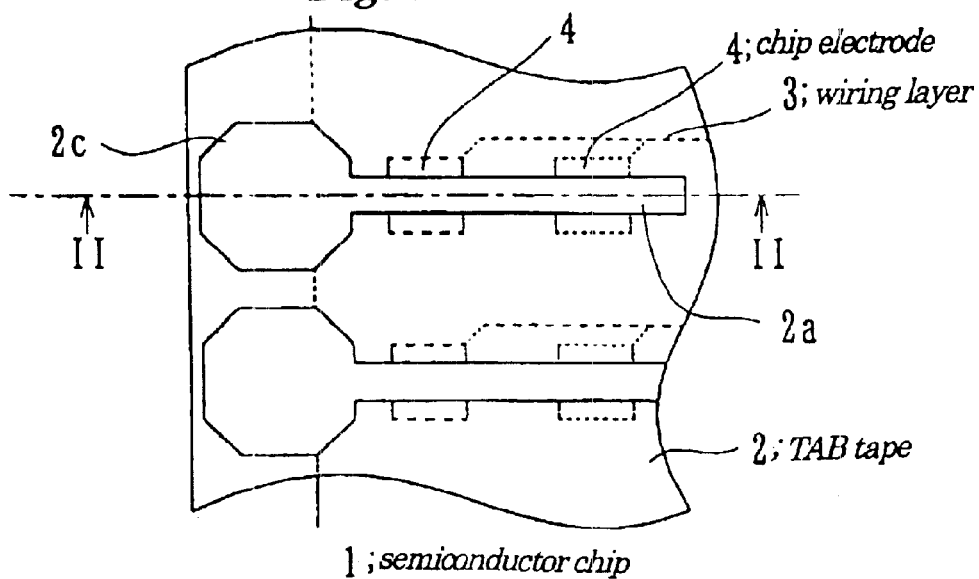
FIG. 1 is a fragmentary plan view of a semiconductor device according to a first embodiment of this invention.

FIG. 1 is a fragmentary plan view of a semiconductor device according to a first embodiment of this invention.

Figure 8:
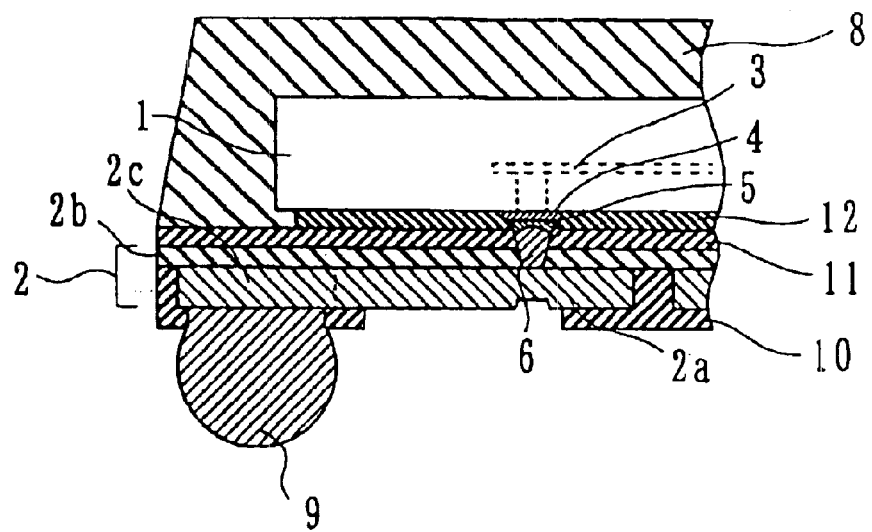
FIG. 8 is a fragmentary, enlarged cross-sectional view taken along line VIII—VIII of FIG. 7.

In FIG. 1, parts or elements similar to those of FIG. 8 are designated to the same reference numbers. A semiconductor chip 1 is disposed on a TAB (tape automated bonding) tape 2, which is a film carrier (wiring substrate), has a size substantially equal to that of the TAB tape 2. Two chip electrodes 4 as of aluminum (Al) are connected to a common wiring layer 3 of the semiconductor chip 1.

Each of the chip electrodes 4 of the semiconductor chip 1 is electrically connected with a common wiring 2a on the TAB tape 2, and at one end of the wiring 2a, a pad 2c is formed to which a bump is to be attached. The wiring 2a is formed of copper in a desired pattern on the TAB tape 2.

The fabrication process of the semiconductor device of the first embodiment will now be described with reference to FIGS. 2(a) and 2(b).

Figure 2A:
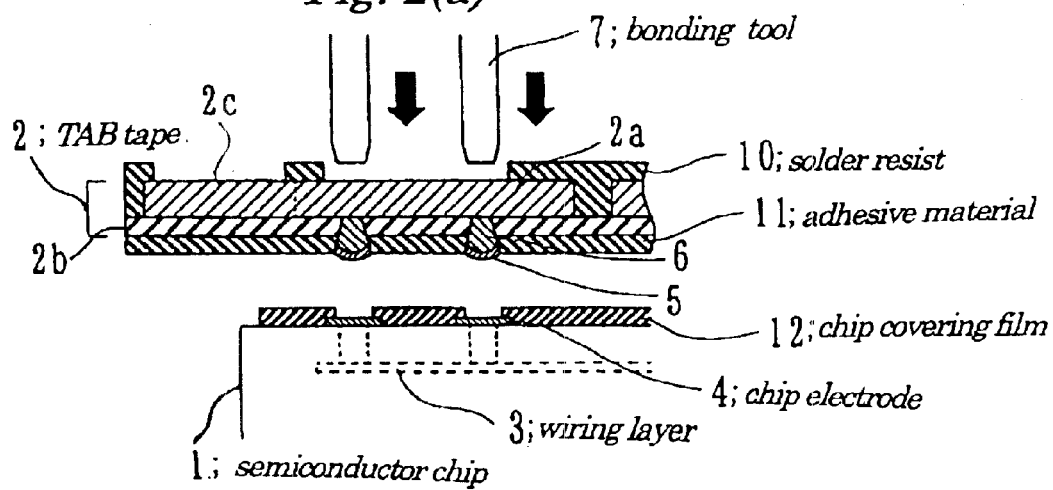
FIGS. 2(a) and 2(b) are fragmentary cross-sectional views taken along line II—II of FIG. 1, showing the process in which the semiconductor device of FIG. 1 is fabricated.
Figure 2B:
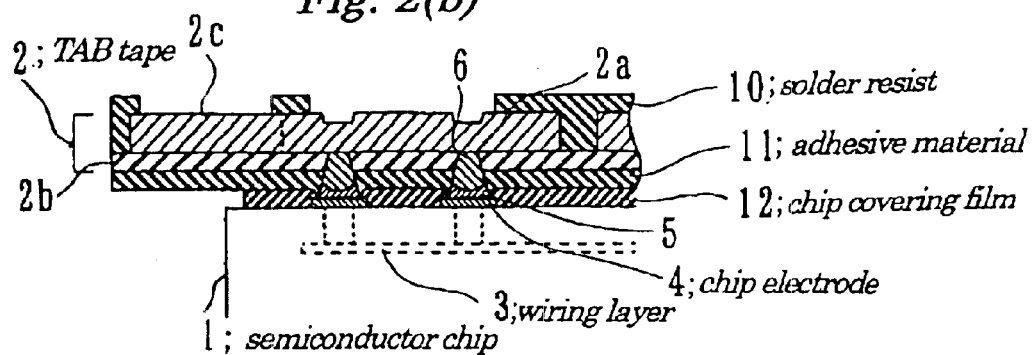

FIGS. 2(a) and 2(b) are cross-sectional views taken along line II—II of FIG. 1, showing the process in which the semiconductor device of FIG. 1 is fabricated.

Firstly, in FIG. 2(a), the TAB tape 2 serving as a film carrier is composed of a polyimide tape 2b, which is to be a base, and a wiring 2a of copper foil formed on the polyimide tape 2b. Then, with the bumps 5 aligned with the chip electrodes 4, the wiring 2a is pressed against the bumps 6 with application of heat or ultrasonic waves by two bonding tools 7. Thus the semiconductor chip 1 is mounted on the TAB tape 2.

As shown in FIG. 2(b), the pressure of the bonding tools 7 deforms the individual bump 5 to form gold-aluminum (Au.Al) alloy at the contact surface, and as a result, the two bumps 5 and the chip electrodes are pressed against each other under heat.

For a stronger joining strength, three or more chip electrodes 4 may be disposed one in corresponding to each set of the bumps 5 and 6.

Figure 3:
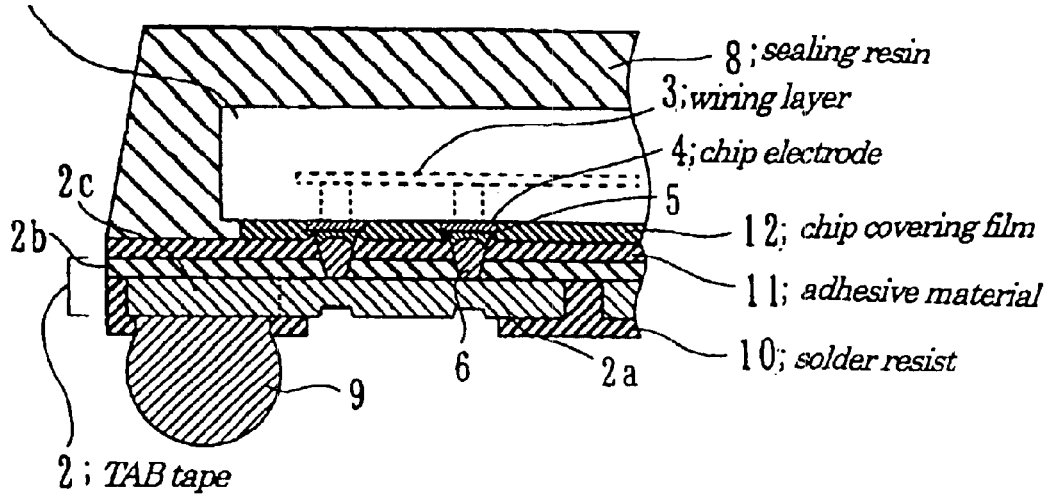
FIG. 3 is a fragmentary cross-sectional view showing a semiconductor package to which the construction of FIG. 1 is applied.

FIG. 3 is a fragmentary cross-sectional view showing a semiconductor package in which the structure of FIG. 1 is incorporated.

In FIG. 3, the wiring 2a is connected at two positions one to each of the chip electrodes 4 via the respective sets of bumps 5, 6. At one end of the wiring 2a, a pad 2c is formed to which a large bump 9 for connection with a package substrate is mounted.

Figure 4:
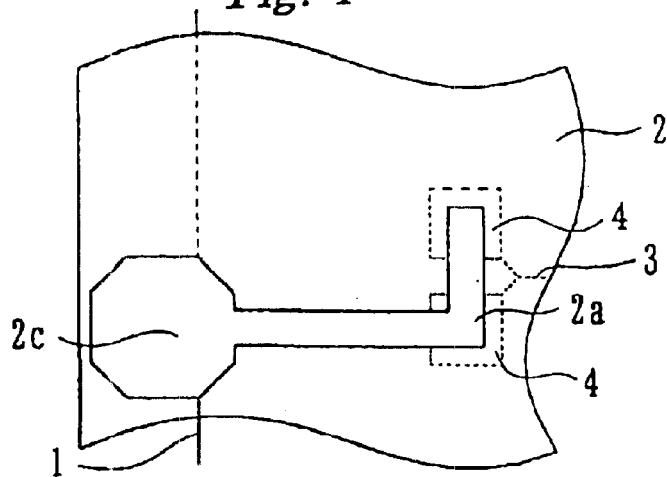
FIG. 4 is a fragmentary plan view showing a semiconductor device according to a second embodiment of the invention.
Figure 5:
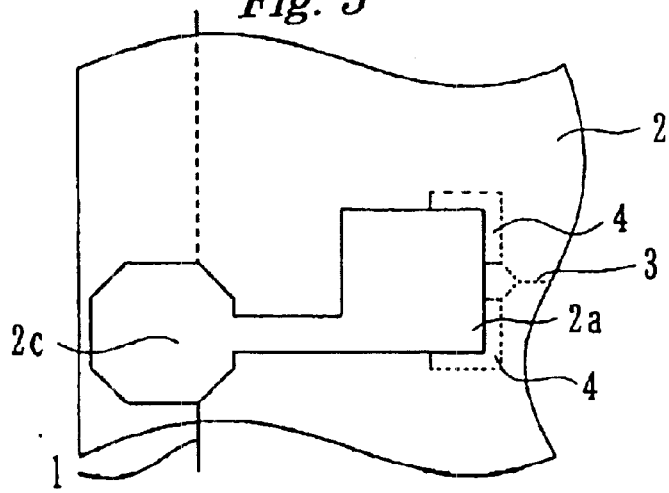
FIG. 5 is a fragmentary plan view showing a semiconductor device according to a third embodiment of the invention.

FIGS. 4 and 5 are fragmentary plan views showing second and third embodiments of the invention.

In FIGS. 4 and 5, parts or elements similar to those of FIG. 3 are designated by the same reference numbers. In the second and third embodiments, the two chip electrodes 4 connected with one and the same wiring layer 3 are arranged parallel to an edge of the semiconductor chip 1.

In the second embodiment of FIG. 4, a wiring 2a bent (by a right angle) at the other end portion is connected to the two chip electrodes 4. In the third embodiment of FIG. 5, a wiring 2a having an end width larger than the distance of the two chip electrodes 4. Of course, in either case, the wiring 2a and the chip electrodes 4 are interconnected via bumps (not shown).

This invention can applied also to any terminal, such as a power-source terminal (VCC), a ground terminal (GND) and a signal terminal, of the semiconductor chip 1. If it is applied to the ground terminal, the following results can be obtained.

Namely, in general, a semiconductor chip is equipped with a plurality of power-source terminals and a plurality of ground terminals so that, if connection fault happens to occur at one joint, the other joints remain closed to completely perform its original function. However, if connection fault is found even at one joint during product inspection by the user, he or she might doubt about the technology level and technology level of the manufacturer. Such danger can be avoided by applying this invention to at least power-source and ground terminals. Although, as a demerit, the area occupied by the chip electrodes would increase, possible influence is negligibly small as long as the invention is applied to only power-source terminals and ground terminals. Besides, since sure connection can be achieved, it is valuable to apply the invention to power-source terminals and ground terminals even with some risk of increasing the area the chip electrodes occupy.

Figure 6:
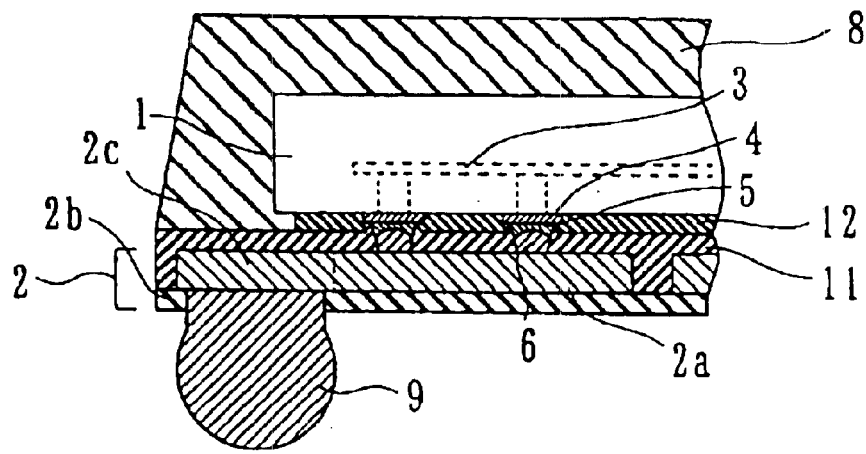
FIG. 6 is a fragmentary cross-sectional view showing a semiconductor device according to a fourth embodiment of the invention.
Figure 7:
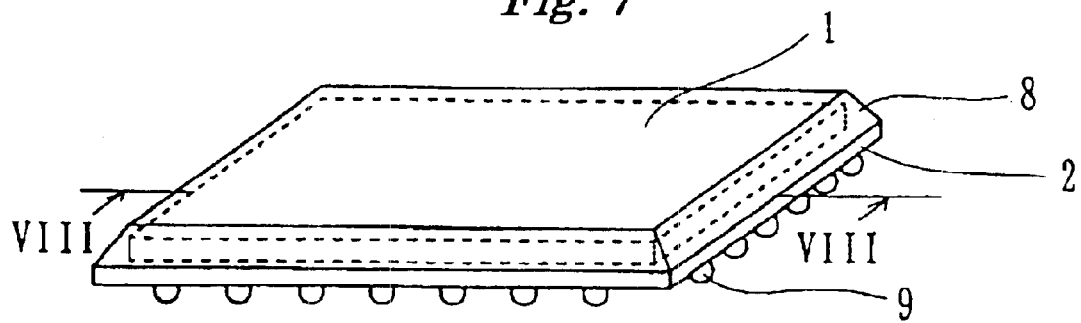
FIG. 7 is a perspective view showing a conventional ordinary-type CSP (chip size package)

In the illustrated embodiments, the bumps 5 are disposed on the rear surface of the semiconductor chip 1. Alternatively, the wiring 2a and the bumps 5 are disposed in conforming relationship with one another as shown in FIG. 6.

According to the semiconductor device of this invention, the wiring on the wiring substrate is connected with two or more chip electrodes connected to a common wiring layer of the semiconductor chip so that, if even a single joint happens to be separated, the other joints remain closed. Accordingly the semiconductor device is free of any connection fault as a whole.

It is thus apparent that the present invention is not limited to the above embodiments but may be changed and modified without departing from the scope and spirit of the invention.

Finally, the present application claims the priority of Japanese Patent Application No. Hei9-359478 filed on Dec. 26, 1997, which is herein incorporated by reference.

What is claimed is:

1. A semiconductor device comprising:
    a wiring substrate having a predetermined pattern of wiring formed on one surface, said wiring having a common wiring;
    a semiconductor chip disposed on the other surface of said wiring substrate, and having a common wiring layer and at least one chip electrode set comprising at least two chip electrodes connected to said common wiring layer, wherein said at least two chip electrodes are arranged from an edge of said semiconductor chip toward its inner side;
    said wiring substrate having at least one through-hole set comprising at least two through-holes formed in conforming relationship with said at least two chip electrodes; and
    at least one bump set comprising at least two pairs of bumps, each pair of which is formed in any one of said at least two through-holes of said wiring substrate and electrically connecting between said common wiring of said wiring substrate and said at least two chip electrodes,
    wherein said at least two pairs of bumps each comprise a first bump and a second bump integrated with each other.

2. A semiconductor device according to claim 1, wherein said chip electrodes comprise at least one kind of terminals selected from ground, power-source and signal terminals of said semiconductor chip.

3. A semiconductor device according to claim 1, and comprising at least two chip electrode sets each comprising at least two chip electrodes in a common wiring layer.

4. A semiconductor device comprising:
    a wiring substrate having a predetermined pattern of wiring formed on one surface, said wiring having a common wiring;
    a semiconductor chip disposed on the other surface of said wiring substrate, and having a common wiring layer and at least one chip electrode set comprising at least two chip electrodes connected to said common wiring layer, wherein said at least two chip electrodes are arranged parallel to an edge of said semiconductor chip and said common wiring of said wiring substrate is bent at at least one position;
    said wiring substrate having at least one through-hole set comprising at least two through-holes formed in conforming relationship with said at least two chip electrodes; and
    at least one bump set comprising at least two pairs of bumps, each pair of which is formed in any one of said at least two through-holes of said wiring substrate and electrically connecting between said common wiring of said wiring substrate and said at least two chip electrodes,
    wherein said at least two pairs of bumps each comprise a first bump and a second bump integrated with each other.

5. A semiconductor device according to claim 4, wherein said chip electrodes comprise at least one kind of terminals selected from ground, power-source and signal terminals of said semiconductor chip.

6. A semiconductor device according to claim 4, and comprising at least two chip electrode sets each comprising at least two chip electrodes in a common wiring layer.

7. A semiconductor device comprising:
    a wiring substrate having a predetermined pattern of wiring formed on one surface, said wiring having a common wiring;
    a semiconductor chip disposed on the other surface of said wiring substrate, and having a common wiring layer and at least one chip electrode set comprising at least two chip electrodes connected to said common wiring layer, wherein said at least two chip electrodes are arranged parallel to an edge of said semiconductor chip and said common wiring of said wiring substrate has an end width larger than an inter-electrode distance between said chip electrodes;
    said wiring substrate having at least one through-hole set comprising at least two through-holes; and
    at least one bump set comprising at least two pairs of bumps, each pair of which is formed in any one of said at least two through-holes of said wiring substrate and electrically connecting between said common wiring of said wiring substrate and said at least two chip electrodes,
    wherein said at least two pairs of bumps each comprise a first bump and a second bump integrated with each other.

8. A semiconductor device according to claim 7, wherein said chip electrodes comprise at least one kind of terminals selected from ground, power-source and signal terminals of said semiconductor chip.

9. A semiconductor device according to claim 7, and comprising at least two chip electrode sets each comprising at least two chip electrodes in a common wiring layer.

10. A semiconductor device comprising:
    a wiring substrate having a predetermined pattern of wiring formed on one surface, said wiring having a common wiring;
    a semiconductor chip disposed on said one surface of said wiring substrate, and having a common wiring layer and at least one chip electrode set comprising at least two chip electrodes connected to said common wiring layer, wherein said at least two chip electrodes are arranged from an edge of said semiconductor chip toward its inner side; and
    at least one bump set comprising at least two pairs of bumps, each pair of which is formed on said one surface of said wiring substrate in conforming relationship with any one of said at least two chip electrodes and electrically connecting between said common wiring of said wiring substrate and said at least two chip electrodes,
    wherein said at least two pairs of bumps each comprise a first bump and a second bump integrated with each other.

11. A semiconductor device according to claim 10, wherein said chip electrodes comprise at least one kind of terminals selected from ground, power-source and signal terminals of said semiconductor chip.

12. A semiconductor device according to claim 10, and comprising at least two chip electrode sets each comprising at least two chip electrodes in a common wiring layer.

13. A semiconductor device comprising:
- a wiring substrate having a predetermined pattern of wiring formed on one surface, said wiring having a common wiring;
- a semiconductor chip disposed on said one surface of said wiring substrate and having a common wiring layer and at least one chip electrode set comprising at least two chip electrodes connected to said common wiring layer, wherein said at least two chip electrodes are arranged parallel to an edge of said semiconductor chip and said common wiring of said wiring substrate is bent at at least one position; and
- at least one bump set comprising at least two pairs of bumps, each pair of which is formed on said one surface of said wiring substrate in conforming relationship with any one of said at least two chip electrodes and electrically connecting between said common wiring of said wiring substrate and said at least two chip electrodes,
- wherein said at least two pairs of bumps each comprise a first bump and a second bump integrated with each other.

14. A semiconductor device according to claim 13, wherein said chip electrodes comprise at least one kind of terminals selected from ground, power-source and signal terminals of said semiconductor chip.

15. A semiconductor device according to claim 13, and comprising at least two chip electrode sets each comprising at least two chip electrodes in a common wiring layer.

16. A semiconductor device comprising:
- a wiring substrate having a predetermined pattern of wiring formed on one surface, said wiring having a common wiring;
- a semiconductor chip disposed on said one surface of said wiring substrate, and having a common wiring layer and at least one chip electrode set comprising at least two chip electrodes connected to said common wiring layer, wherein said at least two chip electrodes are arranged parallel to an edge of said semiconductor chip and said common wiring of said wiring substrate has an end width larger than an inter-electrode distance between said chip electrodes; and
- at least one bump set comprising at least two pairs of bumps, each pair of which is formed on said one surface of said wiring substrate in conforming relationship with any one of said at least two chip electrodes and electrically connecting between said common wiring of said wiring substrate and said at least two chip electrodes,
- wherein said at least two pairs of bumps each comprise a first bump and a second bump integrated with each other.

17. A semiconductor device according to claim 16, wherein said chip electrodes comprise at least one kind of terminals selected from ground, power-source and signal terminals of said semiconductor chip.

18. A semiconductor device according to claim 16, and comprising at least two chip electrode sets each comprising at least two chip electrodes in a common wiring layer.

19. A semiconductor device comprising:
- a TAB (tape automated bonding) tape having a predetermined pattern of wiring formed on one surface, said wiring having a common wiring;
- a semiconductor chip disposed on the other surface of said TAB tape, and having a common wiring layer and at least one chip electrode set comprising at least two chip electrodes connected to said common wiring layer, wherein said at least two chip electrodes are arranged from an edge of said semiconductor chip toward its inner side;
- said TAB tape having at least one through-hole set comprising at least two through-holes formed in conforming relationship with said at least two chip electrodes; and
- at least one bumps set comprising at least two pairs of bumps, each pair of which is formed in any one of said at least two through-holes of said TAB tape electrically connecting between said common wiring of said TAB tape and said at least two chip electrodes,
- wherein said at least two pairs of bumps each comprise a first bump and a second bump integrated with each other.

20. A semiconductor device according to claim 19, wherein said chip electrodes comprise at least one kind of terminals selected from ground, power-source and signal terminals of said semiconductor chip.

21. A semiconductor device according to claim 19, and comprising at least two chip electrode sets each comprising at least two chip electrodes in a common wiring layer.

22. A semiconductor device comprising:
- a TAB (tape automated bonding) tape having a predetermined pattern of wiring formed on one surface, said wiring having a common wiring;
- a semiconductor chip disposed on the other surface of said TAB tape, and having a common wiring layer and at least one chip electrode set comprising at least two chip electrodes connected to said common wiring layer, wherein said at least two chip electrodes are arranged parallel to an edge of said semiconductor chip and said common wiring of said TAB tape is bent at at least one position;
- said TAB tape having at least one through-hole set comprising at least two through-holes formed in conforming relationship with said at least two chip electrodes; and
- at least one bump set comprising at least two pairs of bumps, each pair of which is formed in any one of said at least two through-holes of said TAB tape and electrically connecting between said common wiring of said TAB tape and said at least two chip electrodes,
- wherein said at least two pairs of bumps each comprise a first bump and a second bump integrated with each other.

23. A semiconductor device according to claim 22, wherein said chip electrodes comprise at least one kind of terminals selected from ground, power-source and signal terminals of said semiconductor chip.

24. A semiconductor device according to claim 22, and comprising at least two chip electrode sets each comprising at least two chip electrodes in a common wiring layer.

25. A semiconductor device comprising:
- a TAB (tape automated bonding) tape having a predetermined pattern of wiring formed on one surface, said wiring having a common wiring;
- a semiconductor chip disposed on the other surface of said TAB tape, and having a common wiring layer and at least one chip electrode set comprising at least two chip electrodes connected to said common wiring layer, wherein said at least two chip electrodes are arranged parallel to an edge of said semiconductor chip and said common wiring of said TAB tape has an end width larger than an inter-electrode distance between said chip electrodes;

said TAB tape having at least one through-hole set comprising at least two through-holes formed in conforming relationship with said at least two chip electrodes; and at least one bump set comprising at least two pairs of bumps, each pair of which is formed in any one of said at least two through-holes of said TAB tape and electrically connecting between said common wiring of said TAB tape and said at least two chip electrodes, wherein said at least two pairs of bumps each comprise a first bump and a second bump integrated with each other.

26. A semiconductor device according to claim 25, wherein said chip electrodes comprise at least one kind of terminals selected from ground, power-source and signal terminals of said semiconductor chip.

27. A semiconductor device according to claim 25, and comprising at least two chip electrode sets each comprising at least two chip electrodes in a common wiring layer.

28. A semiconductor device comprising:

a TAB (tape automated bonding) tape having a predetermined pattern of wiring formed on one surface, said wiring having a common wiring;

a semiconductor chip disposed on said one surface of said TAB tape, and having a common wiring layer and at least one chip electrode set comprising at least two chip electrodes connected to said common wiring layer, wherein said at least two chip electrodes are arranged from an edge of said semiconductor chip toward its inner side; and at least one bump set comprising at least two pairs of bumps, each pair of which is formed on said one surface of said TAB tape in conforming relationship with any one of said at least two chip electrodes and electrically connecting between said common wiring of said TAB tape with and said at least two chip electrodes, wherein said at least two pairs of bumps each comprise a first bump and a second bump integrated with each other.

29. A semiconductor device according to claim 28, wherein said chip electrodes comprise at least one kind of terminals selected from ground, power-source and signal terminals of said semiconductor chip.

30. A semiconductor device according to claim 28, and comprising at least two chip electrode sets each comprising at least two chip electrodes in a common wiring layer.

31. A semiconductor device comprising:

a TAB (tape automated bonding) tape having a predetermined pattern of wiring formed on one surface, said wiring having a common wiring;

a semiconductor chip disposed on said one surface of said TAB tape, and having a common wiring layer and at least one chip electrode set comprising at least two chip electrodes connected to said common wiring layer, wherein said at least two chip electrodes are arranged parallel to an edge of said semiconductor chip and said common wiring of said TAB tape is bent at at least one position; and at least one bump set comprising at least two pairs of bumps, each pair of which is formed on said one surface of said TAB tape in conforming relationship with any one of said at least two chip electrodes and electrically connecting between said common wiring of said TAB tape and said at least two chip electrodes, wherein said at least two pairs of bumps each comprise a first bump and a second bump integrated with each other.

32. A semiconductor device according to claim 31, wherein said chip electrodes comprise at least one kind of terminals selected from ground, power-source and signal terminals of said semiconductor chip.

33. A semiconductor device according to claim 31, and comprising at least two chip electrode sets each comprising at least two chip electrodes in a common wiring layer.

34. A semiconductor device comprising:

a TAB (tape automated bonding) tape having a predetermined pattern of wiring formed on one surface, said wiring having a common wiring;

a semiconductor chip disposed on said one surface of said TAB tape, and having a common wiring layer and at least one chip electrode set comprising at least two chip electrodes connected to said common wiring layer, wherein said at least two chip electrodes are arranged parallel to an edge of said semiconductor chip and said common wiring of said TAB tape has an end width larger than an inter-electrode distance between said chip electrodes; and at least one bump set comprising at least two pairs of bumps, each pair of which is formed on said one surface of said TAB tape in conforming relationship with any one of said at least two chip electrodes and electrically connecting between said common wiring of said TAB tape with and said at least two chip electrodes, wherein said at least two pairs of bumps each comprise a first bump and a second bump integrated with each other.

35. A semiconductor device according to claim 34, wherein said chip electrodes comprise at least one kind of terminals selected from ground, power-source and signal terminals of said semiconductor chip.

36. A semiconductor device according to claim 34, and comprising at least two chip electrode sets each comprising at least two chip electrodes in a common wiring layer.

* * * * *